United States Patent
McCoy

(10) Patent No.: US 7,551,039 B2
(45) Date of Patent: Jun. 23, 2009

(54) PHASE ADJUSTMENT IN PHASE-LOCKED LOOPS USING MULTIPLE OSCILLATOR SIGNALS

(75) Inventor: Scott McCoy, Halfway, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 81 days.

(21) Appl. No.: 11/875,497

(22) Filed: Oct. 19, 2007

(65) Prior Publication Data
US 2009/0102569 A1  Apr. 23, 2009

(51) Int. Cl.
*H03L 7/06* (2006.01)
(52) U.S. Cl. .................... 331/49; 331/1 A; 331/17; 331/18; 331/25
(58) Field of Classification Search .............. 331/1 A, 331/8, 14, 17, 18, 25, DIG. 2, 46, 49
See application file for complete search history.

(56) References Cited

U.S. PATENT DOCUMENTS

| 4,879,529 | A | * | 11/1989 | Schroth et al. ............... 331/14 |
| 6,731,709 | B2 | | 5/2004 | Doblar |
| 6,757,350 | B1 | | 6/2004 | Chesavage |

* cited by examiner

*Primary Examiner*—David Mis

(57) ABSTRACT

Phase-locked loop (PLL) logic comprises an oscillator that produces a first oscillator signal and phase detect logic that determines a phase difference between the first oscillator signal and a second oscillator signal. After the second oscillator signal is replaced by a third oscillator signal, the phase detect logic determines another phase difference between the first oscillator signal and the third oscillator signal. The PLL removes the phase difference from the another phase difference to produce an intermediate signal. The oscillator adjusts the first oscillator signal using the intermediate signal.

15 Claims, 2 Drawing Sheets

PHASE ADJUSTMENT IN PHASE-LOCKED LOOPS USING MULTIPLE OSCILLATOR SIGNALS

BACKGROUND

Various electronic devices implement hardware logic that is driven by one or more clocks. Problems may arise which cause the clock(s) to fail. To protect against such failure, many computer systems implement multiple clock signal sources (e.g., oscillators) in a "failover" configuration. In such a configuration, if a primary oscillator fails, a backup oscillator takes over the tasks of the primary oscillator. However, the oscillators are likely to be out of phase with each other. As a result, failing over from the primary oscillator to the backup oscillator may introduce loss of phase lock, etc. into the clock signal, thereby negatively affecting the overall performance of the electronic device within which the clock is implemented.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, in the following discussion and in the claims, the term "couple" or "couples" is intended to mean either an indirect, direct, optical or wireless electrical connection. Thus, if a first device couples to a second device, that connection may be through a direct electrical connection or through an indirect electrical connection via other devices and connections. Further, in the following discussion and in the claims, the term "match" is intended to mean "to make identical to," "to make substantially similar, but not identical, to," "to attempt to make identical to," or "to attempt to make substantially similar, but not identical, to." Further still, the term "or" is to be interpreted in an inclusive sense rather than in an exclusive sense.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
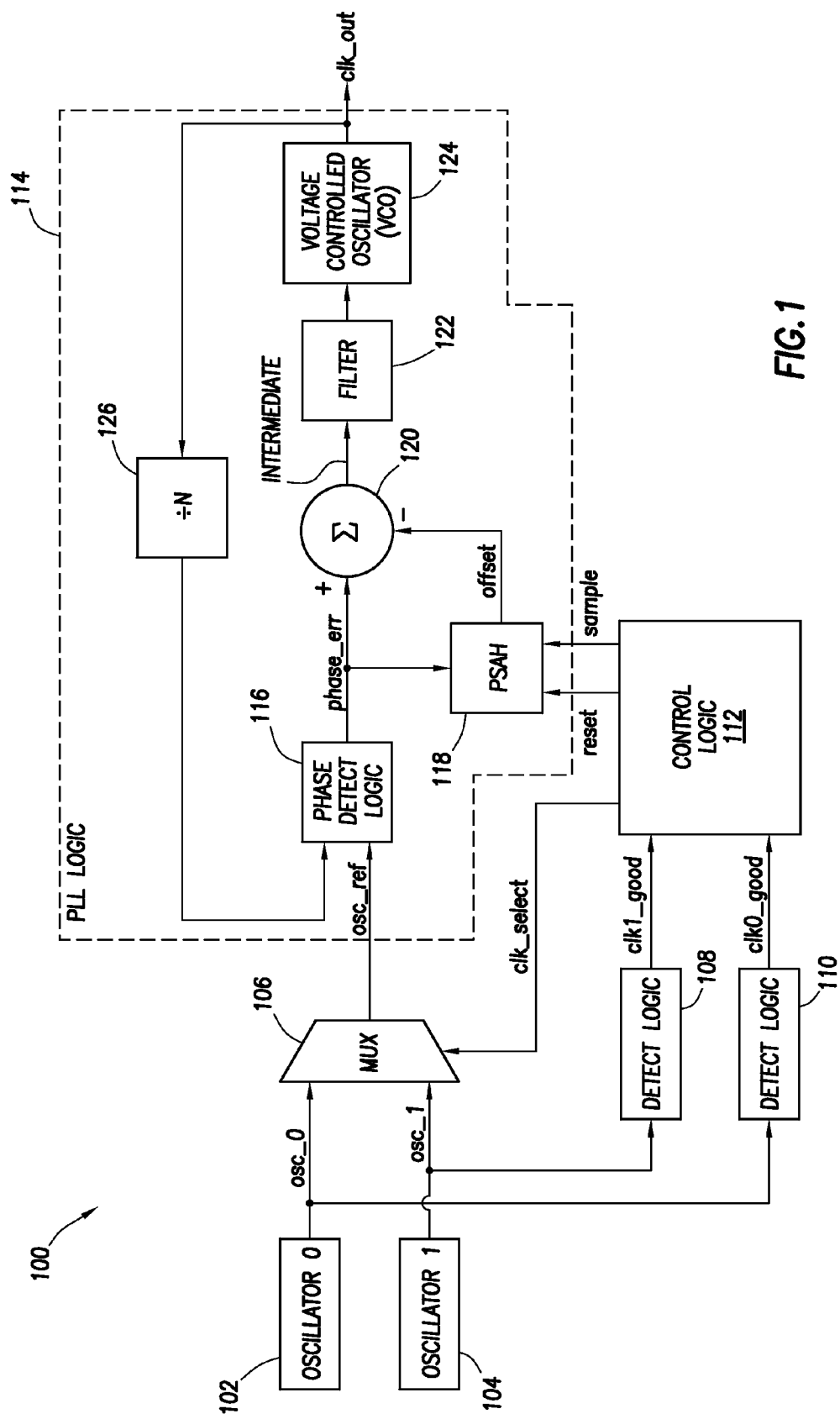
FIG. 1 shows a block diagram of an illustrative clock circuit, in accordance with various embodiments.

Disclosed herein are various embodiments of a technique that mitigates problems that occur as a result of switching between oscillator signals having mismatched phases. FIG. 1 shows a block diagram of an illustrative clocking logic 100, in accordance with various embodiments. The clocking logic 100 comprises a primary oscillator 102, a backup oscillator 104, a multiplexer (MUX) 106, clock detect logic 108, clock detect logic 110, control logic 112 and a phase-locked loop (PLL) logic 114.

PLL logic 114 is an electronic control system that generates a signal that has a fixed relation to the phase of a reference signal. PLL logic responds to the phase and/or frequency of the input signal(s), automatically raising or lowering the phase and/or frequency of a controlled oscillator until it is matched to the reference in frequency, phase or both. Although the embodiments disclosed herein are described below in terms of adjusting the phase of signals output by PLL logic, in some embodiments, the techniques described herein also may be adapted to adjust the frequency of signals output by PLL logic.

PLL logic 114 comprises phase detect logic 116, phase sample and hold (PSAH) logic 118, subtraction logic 120, a filter 122, a voltage-controlled oscillator (VCO) 124 and a frequency divider 126. The clocking logic 100 may be housed within any suitable electronic device that uses a clock, including computers, digital music players, personal digital assistants, gaming consoles, etc. The functionality of the clocking logic 100 is now described.

Each of the oscillators 102 and 104 may comprise any suitable type of oscillator. For example, each of the oscillators may comprise a harmonic oscillator, relaxation oscillator, crystal oscillator, etc. The oscillators 102 and 104 are provided within the clocking logic 100 to provide redundancy, so that if one of the oscillators fails, the remaining oscillator performs in lieu of the failed oscillator. For purposes of this discussion, the oscillator 102 is referred to as the "primary" oscillator and the oscillator 104 is referred to as the "backup" oscillator, although in some embodiments, the oscillator 104 may be the "primary" oscillator and the oscillator 102 may be the "backup" oscillator.

Each of the oscillators 102 and 104 couples to the MUX 106. Assuming that each of the oscillators is functioning properly, each of the oscillators 102 and 104 provides an oscillation signal to the MUX 106. In particular, the primary oscillator 102 provides an oscillation signal OSC_0 and the secondary oscillator 104 provides an oscillation signal OSC_1. The MUX 106 allows one of the oscillation signals OSC_0 and OSC_1 to pass through the MUX 106, depending on the control signal CLK_SELECT received from the control logic 112. For example, in some embodiments, when the CLK_SELECT signal is HIGH, the OSC_0 signal passes through the MUX 106 and the OSC_1 signal does not. In some embodiments, when the CLK_SELECT signal is LOW, the OSC_1 signal passes through the MUX 106 and the OSC_0 signal does not.

The control logic 112 determines the status of the CLK_SELECT signal based on the operational status of the oscillators 102 and 104. In some embodiments, when both the oscillators 102 and 104 are operating properly, the primary oscillator 102 takes precedence and, as a result, the control logic 112 sets the status of CLK_SELECT control signal such that OSC_0 passes through the MUX 106. In other embodiments, when both the oscillators 102 and 104 are operation properly, the oscillator 104 takes precedence and, as a result, the control logic 112 sets the status of CLK_SELECT such that OSC_1 passes through the MUX 106. If one of the oscillators has failed, the control logic 112 sets the status of CLK_SELECT such that the signal generated by the remaining oscillator passes through the MUX 106. For instance, if the primary oscillator 102 has failed, the control logic 112 sets CLK_SELECT such that OSC_1 passes through the MUX 106.

The control logic 112 determines the operational status of the oscillators 102 and 104 based on information provided by detect logic 108 and detect logic 110. Detect logic 108 monitors the output of the backup oscillator 104. If the detect logic 108 determines that the backup oscillator 104 is not providing the signal OSC_1, the detect logic 108 alerts the control logic 112 accordingly (e.g., via transmission of an alert signal CLK1_GOOD). Similarly, the detect logic 110 monitors the output of the primary oscillator 102. If the detect logic 110 determines that the primary oscillator 102 is not providing the signal OSC_0, the detect logic 110 alerts the control logic 112 accordingly (e.g., via transmission of an alert signal CLK0_GOOD). In this way, the control logic 112 regulates which oscillator signal passes through the MUX 106.

The oscillator signal that passes through the MUX 106, referred to as OSC_REF, is provided to the PLL logic 114. One purpose of the PLL logic 114 is to generate and output a clock signal (described below) with a consistent phase. If the phase of the output clock signal generated by the PLL logic 114 begins to drift, the PLL logic 114 uses OSC_REF to adjust the phase of the output clock signal (as described below) so that the drift is mitigated. The operation of the PLL logic 114 is now described in detail.

In operation, the VCO 124 generates and outputs a clock signal CLK_OUT. In addition to being output, the signal CLK_OUT also is fed back to the phase detect logic 116 in a feedback loop via the frequency divider 126, which optionally divides the CLK_OUT signal by a predetermined integer value. The CLK_OUT signal is provided to the phase detect logic 116 (even when altered by the divider 126 or other intervening circuit logic, the signal output by the VCO 124 and the signal received by the phase detect logic 116 are, in some embodiments, still considered to be the same signal). In turn, the phase detect logic 116 determines the difference in phase between the CLK_OUT signal and the OSC_REF signal. Referred to as PHASE_ERR, a signal indicating this difference is output by the phase detect logic 116 and is provided to the PSAH logic 118 and the subtraction logic 120.

As described further below, the PSAH logic 118 uses the PHASE_ERR signal to generate and output a signal OFFSET, which is provided to the subtraction logic 120. Also as described below, the subtraction logic 120 subtracts the OFFSET signal from the PHASE_ERR signal. Assume for now that OFFSET=0. Thus, the INTERMEDIATE signal output by the subtraction logic 120 is the same as the PHASE_ERR signal output by the phase detect logic 116. Like the PHASE_ERR signal, the INTERMEDIATE signal is indicative of the difference in phase between the CLK_OUT and OSC_REF signals. The INTERMEDIATE signal output by the subtraction logic 120 is then filtered (e.g., low-pass filtered) by the filter 122 and is provided to the VCO 124. The VCO 124 receives the INTERMEDIATE signal and, based on the difference in phase between the CLK_OUT and OSC_REF signals, the VCO 124 adjusts the phase of the signal CLK_OUT that it outputs. In this way, the phase of the CLK_OUT signal is prevented from drifting.

For example, the VCO 124 may output a signal CLK_OUT having a phase of 60 degrees. Like the signal CLK_OUT, the signal OSC_REF from the oscillator—which serves as a reference signal for the phase detect logic 116—also may have a phase of 60 degrees. The phase detect logic 116 may determine that the difference in phase between CLK_OUT and OSC_REF is 0. Stated otherwise, because the signals output by the oscillators 102 and/or 104 tend not to drift, they serve as reference signals by which phase drift in the CLK_OUT signal is measured. Accordingly, the phase detect logic 116 outputs the signal PHASE_ERR indicating that this difference in phase is 0. Because we have assumed the OFFSET to be 0, the output INTERMEDIATE of the subtraction logic 120 also is 0. The signal INTERMEDIATE is filtered by the filter 122 and is provided to the VCO 124. The VCO 124 determines that because INTERMEDIATE is 0, the phase of CLK_OUT has not drifted. Thus, the VCO 124 does not adjust the phase of CLK_OUT.

Continuing with this example, assume that the phase of CLK_OUT drifts from 60 degrees to 70 degrees. The phase detect logic 116 determines that the CLK_OUT signal, which has a phase of 70 degrees, and the oscillator reference signal OSC_REF, which has a phase of 60 degrees, are separated by 10 degrees in phase. Accordingly, the phase detect logic 116 outputs a signal PHASE_ERR that indicates this difference of 10 degrees. Because we continue to assume that the signal OFFSET is 0, the subtraction logic 120 outputs the signal INTERMEDIATE indicating the 10 degree difference mentioned above. The INTERMEDIATE signal is subsequently filtered by the filter 122 and provided to the VCO 124. In turn, the VCO 124 determines that a 10 degree drift in phase has occurred with CLK_OUT and, as a result, the VCO 124 adjusts the phase of CLK_OUT by −10 degrees to mitigate the phase drift.

As described above, failure of the primary oscillator 102 results in failover to the backup oscillator 104. However, the phases of the oscillators 102 and 104 may be substantially different. As a result, although the CLK_OUT signal phase of the PLL 114 may be "tuned" to the phase of the primary oscillator 102, failing over to the backup oscillator 104 may introduce a substantial phase shift to the PLL 114. Such a substantial phase shift may result in undesirable loss of phase lock, etc. As described below, the OFFSET signal is used to mitigate the dangers of such substantial shifts in phase.

Although the OFFSET signal is described above as being 0 for ease of explanation, in operation, the OFFSET signal may not always be 0. For instance, as mentioned, the OFFSET signal may change when one of the oscillators 102 or 104 fails. For example, the primary oscillator 102 may be operating properly, and so the MUX 106 may permit the OSC_0 signal to pass through. However, if the primary oscillator 102 fails, the backup oscillator 104 "takes over" for the primary oscillator 102. Thus, the control logic 112 adjusts the status of the signal CLK_SELECT so that the OSC_1 signal passes through the MUX 106. In addition, the control logic 112 also asserts the SAMPLE signal that is provided to the PSAH 118. The SAMPLE signal, when asserted, causes the PSAH 118 to capture and store the signal PHASE_ERR. The PSAH 118 outputs the phase difference of PHASE_ERR as the OFFSET signal provided to the subtraction logic 120. In turn, the subtraction logic 120 subtracts the OFFSET signal from the PHASE_ERR signal and outputs the difference as INTERMEDIATE. The INTERMEDIATE signal is filtered by filter 122 and is subsequently provided to VCO 124, which uses the phase difference encoded in INTERMEDIATE to adjust the phase of CLK_OUT.

The OFFSET signal is captured and subtracted from PHASE_ERR as described above because, unlike normal phase drift, a switch from the primary oscillator to the backup oscillator may result in a substantially significant difference in phase between the CLK_OUT and OSC_OUT signals. Such a substantial difference may cause various problems, such as loss of phase lock, etc. By subtracting the OFFSET signal from the PHASE_ERR signal as described above, any substantial phase shift introduced by an oscillator failover is mitigated.

For example, assume that the primary oscillator 102 fails and that there is a failover to the backup oscillator 104. Further assume that there is a relatively large phase difference of 50 degrees between the signals associated with the primary and backup oscillators 102 and 104. Prior to failover of the oscillators, the signal CLK_OUT has a phase that matches, or is similar to, that of OSC_0. However, upon failover, the phase of signal CLK_OUT is approximately 50 degrees apart from the phase of OSC_1 (the new reference signal provided to the phase detect logic 116). Because there has been a failover, the control logic 112 asserts the SAMPLE signal, thereby causing the PSAH logic 118 to capture and store the PHASE_ERR signal, which indicates a difference of 50 degrees. The PSAH logic 118 then continually outputs an OFFSET signal indicating the difference of 50 degrees to the subtracting logic 120. Thereafter, the phase of any PHASE_ERR signal that passes through the subtracting logic 120 is adjusted by −50 degrees. In this way, a constant phase offset of 50 degrees is continuously maintained between the CLK_OUT signal and the OSC_1 signal. In this way, the CLK_OUT signal is not affected by the 50 degree phase shift induced by the oscillator failover. Thus, any danger of phase lock loss, etc. caused by such a large phase difference is mitigated.

At the same time, however, the PLL 114 is still able to adjust for phase drift caused by the VCO 124. For example, assume that CLK_OUT is tuned to a phase of 60 degrees, just as the CLK_0 signal has a phase of 60 degrees. If the CLK_OUT produced by the VCO 124 drifts in phase by 5 degrees, the phase detect logic 116 will detect this phase drift and will cause the VCO 124 to compensate by adjusting the phase of CLK_OUT by −5 degrees. In this way, the phase of CLK_OUT is continuously "tuned" to the phase of OSC_0. However, if the primary oscillator 102 fails, the backup oscillator 104 "takes over" for the primary oscillator 102. The backup oscillator 104 may produce the signal OSC_1 with a substantially different phase than that of the primary oscillator 102. For instance, while the phase of OSC_0 was 60 degrees, the phase of OSC_1 may be 110 degrees—a difference of 50 degrees in phase. The control logic 112, having detected the failure of the primary oscillator 102, may assert the SAMPLE signal to the PSAH logic 118. In turn, the PSAH logic 118 may capture and store this difference of 50 degrees (as determined by the phase detect logic 116).

Thereafter, regardless of the PHASE_ERR signal that is produced by the phase detect logic 116, the PSAH logic 118 may output an OFFSET signal indicative of 50 degrees. In this way, the subtracting logic 120 repeatedly adjusts the phase of PHASE_ERR by −50 degrees. Thus, for instance, if the phase detect logic 116 determines that the VCO 124 has caused a phase drift of 5 degrees, the phase detect logic 116 will output a PHASE_ERR signal indicating a 55 degree phase difference between OSC_1 and CLK_OUT (i.e., the original 50 degree difference caused by oscillator failover, plus the 5 degree phase drift caused by the VCO 124). However, the subtraction logic 120 removes 50 degrees from the PHASE_ERR signal, thereby causing the INTERMEDIATE to indicate a phase difference of only 5 degrees. In turn, the VCO 124 adjusts the phase of CLK_OUT by −5 degrees, thereby correcting for the phase drift. In this way, the PLL 114 maintains its ability to correct for phase drift introduced by the VCO 124 while preventing the 50 degree phase difference (caused by the oscillator failover) from reaching the VCO 124 (thereby preventing loss of phase lock and other associated problems).

The PSAH 118 is activated (i.e., powered on) by the control logic 112 using the RESET signal. When the control logic 112 asserts the RESET signal, the PSAH 118 is ready to capture signal PHASE_ERR, but as described above, does not do so until the SAMPLE signal is asserted.

Figure 2:
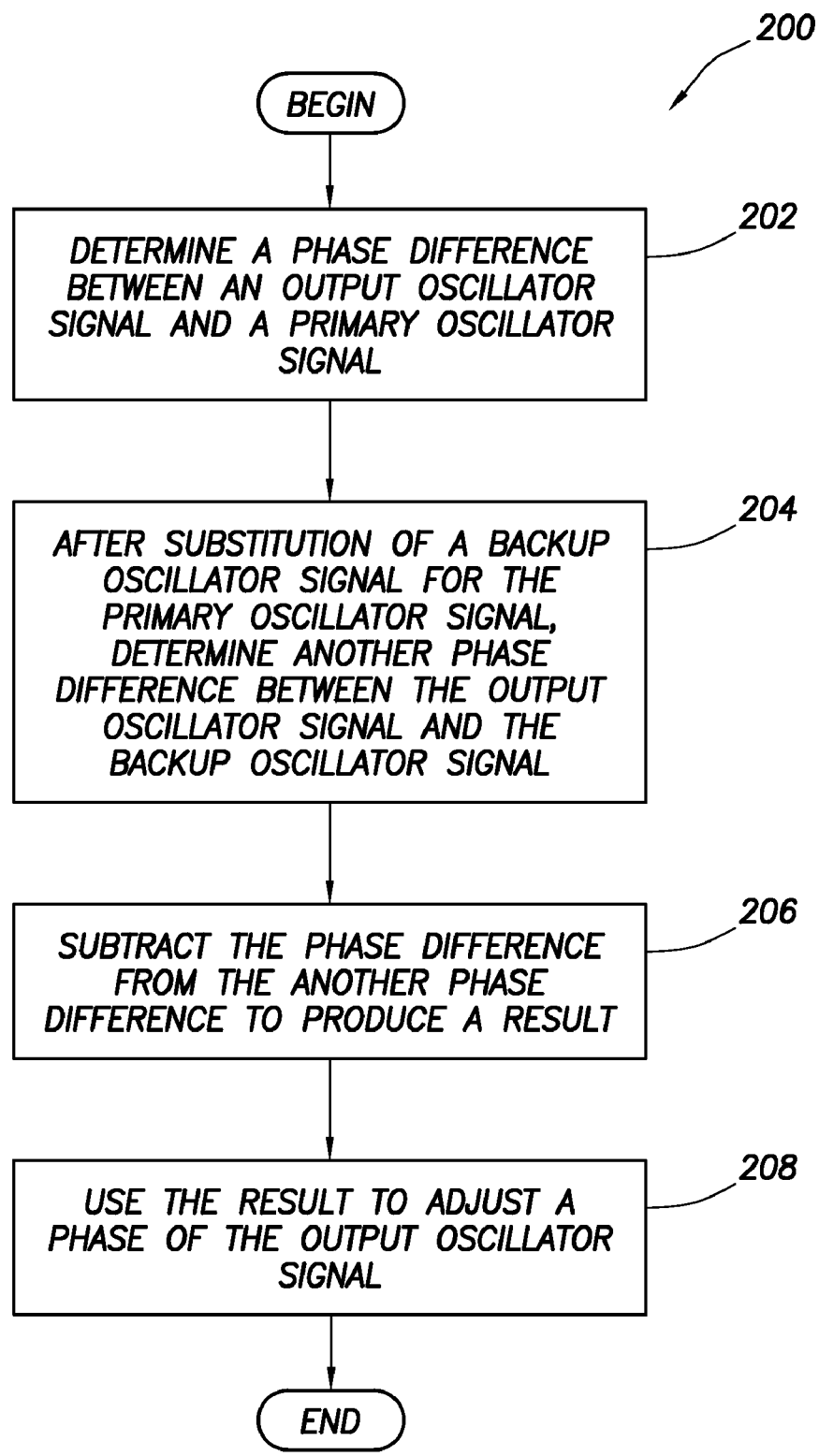
FIG. 2 shows a flow diagram of an illustrative method, in accordance with various embodiments.

FIG. 2 shows a flow diagram of an illustrative method 200 in accordance with various embodiments. The method 200 begins by determining a phase difference between an output oscillator signal and a primary oscillator signal (block 202). After substitution of a backup oscillator signal for the primary oscillator signal (e.g., via failover), the method 200 continues by determining another phase difference between the output oscillator signal and the backup oscillator signal (block 204). The method 200 further comprises subtracting the phase difference from the another phase difference to produce a result (block 206). The method 200 also comprises using the result to adjust a phase of the output oscillator signal (block 208). The various steps of method 200 may be performed in any suitable manner.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. Phase-locked loop (PLL) logic, comprising:
    an oscillator that produces a first oscillator signal;
    phase detect logic that determines a phase difference between the first oscillator signal and a second oscillator signal;
    wherein, after the second oscillator signal is replaced by a third oscillator signal, the phase detect logic determines another phase difference between the first oscillator signal and the third oscillator signal;
    wherein the PLL removes the phase difference from said another phase difference to produce an intermediate signal;
    wherein the oscillator adjusts said first oscillator signal using the intermediate signal.

2. The PLL logic of claim 1, wherein the oscillator comprises a voltage-controlled oscillator (VCO).

3. The PLL logic of claim 1 further comprising phase storage logic that stores said phase difference and subtracts the phase difference from the another difference to produce said intermediate signal.

4. The PLL logic of claim 3, wherein the phase storage logic captures said phase difference from the phase detect logic when an oscillator coupled to the PLL logic fails.

5. The PLL logic of claim 1, wherein the oscillator is housed within a device selected from the group consisting of a computer, a personal digital assistant, a digital music player, a mobile communication device and a gaming console.

6. The PLL logic of claim 1, wherein the oscillator adjusts a phase of the first oscillator signal using the intermediate signal.

7. A system, comprising:
    a first oscillator that produces a first signal having a first phase;
    a second oscillator that produces a second signal having a second phase;
    control logic coupled to the first and second oscillators; and
    phase-locked loop (PLL) logic coupled to the control logic, the PLL produces a third signal having a third phase;

wherein the PLL determines a difference between said first phase and said third phase and adjusts said third phase based on said difference;

wherein, upon failure of the first oscillator, the control logic causes the PLL to store said difference, determine another difference between said second phase and said third phase, remove said difference from said another difference to produce a result, and use the result to adjust said third phase.

8. The system of claim 7, wherein the system comprises a device selected from the group consisting of a computer, a mobile communication device, a digital music player, a personal digital assistant and a gaming console.

9. The system of claim 7, wherein, when the first oscillator fails, the PLL uses the second signal in lieu of the first signal.

10. The system of claim 7, wherein the control logic resets the PLL so that the PLL ceases to store said difference.

11. The system of claim 7, wherein, upon failure of the first oscillator, the control logic causes the PLL to use the second signal in lieu of the first signal.

12. A method, comprising:

determining a phase difference between an output oscillator signal and a primary oscillator signal;

after substitution of a backup oscillator signal for the primary oscillator signal, determining another phase difference between said output oscillator signal and said backup oscillator signal;

subtracting the phase difference from the another phase difference to produce a result; and using the result to adjust a phase of the output oscillator signal.

13. The method of claim 12, wherein determining said phase difference between the output oscillator signal and the primary oscillator signal comprises using an output oscillator that is stored in a device selected from the group consisting of a computer, a mobile communication device, a personal digital assistant, a digital music player and a gaming console.

14. The method of claim 12, wherein determining said phase difference between the output oscillator signal and the primary oscillator signal comprises using a voltage-controlled oscillator (VCO).

15. The method of claim 12 further comprising ceasing to subtract the phase difference from the another phase difference upon substitution of the primary oscillator signal for the backup oscillator signal.

* * * * *